(12) United States Patent
Han et al.

(10) Patent No.: US 9,337,021 B2
(45) Date of Patent: May 10, 2016

(54) THIN FILM STRUCTURE AND METHOD OF FABRICATING THE SAME

(71) Applicant: SEOUL NATIONAL UNIVERSITY R&DB FOUNDATION, Seoul (KR)

(72) Inventors: Heung Nam Han, Seoul (KR); Sung Bo Lee, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 14/402,202

(22) PCT Filed: Feb. 18, 2014

(86) PCT No.: PCT/KR2014/001290
§ 371 (c)(1),
(2) Date: Nov. 19, 2014

(87) PCT Pub. No.: WO2015/041390
PCT Pub. Date: Mar. 26, 2015

(65) Prior Publication Data
US 2015/0325658 A1    Nov. 12, 2015

(30) Foreign Application Priority Data

Sep. 17, 2013  (KR) ................. 10-2013-0111909

(51) Int. Cl.
| H01L 21/00 | (2006.01) |
| H01L 29/00 | (2006.01) |
| H01L 21/02 | (2006.01) |
| H01L 29/04 | (2006.01) |
| C23C 16/34 | (2006.01) |
| C30B 25/18 | (2006.01) |
| C30B 29/40 | (2006.01) |
| H01L 29/20 | (2006.01) |

(52) U.S. Cl.
CPC .......... *H01L 21/02439* (2013.01); *C23C 16/34* (2013.01); *C30B 25/18* (2013.01); *C30B 29/406* (2013.01); *H01L 21/0242* (2013.01); *H01L 21/0245* (2013.01); *H01L 21/0254* (2013.01); *H01L 21/02164* (2013.01); *H01L 21/02488* (2013.01); *H01L 21/02658* (2013.01); *H01L 29/04* (2013.01); *H01L 29/2003* (2013.01)

(58) Field of Classification Search
CPC ... H01L 29/2003; H01L 29/04; H01L 29/201; H01L 21/02488; H01L 21/0254; H01L 21/0245; H01L 21/0242; H01L 21/02164; H01L 21/02439; H01L 21/02658; C23C 16/34; C30B 25/18; C30B 29/406
See application file for complete search history.

(56) References Cited

U.S. PATENT DOCUMENTS 5,760,426 A    6/1998 Marx et al.

FOREIGN PATENT DOCUMENTS

| JP | 11-135889 A | 5/1999 |
| JP | 2002-343718 A | 11/2002 |
| JP | 2003-324069 A | 11/2003 |
| KR | 1020100008123 A | 1/2010 |
| WO | 2012/161451 A2 | 11/2012 |

*Primary Examiner* — Nikolay Yushin
(74) *Attorney, Agent, or Firm* — Ladas & Parry LLP

(57) ABSTRACT

Provided are a thin film structure capable of remarkably reducing the defect density of gallium nitride (GaN), and a method of fabricating the same. The thin film structure includes a supporting substrate including sapphire, and an epilayer disposed on the supporting substrate and including gallium nitride (GaN). An upper part of the supporting substrate facing the epilayer includes a layer of sapphire into which silicon (Si) is diffused or ion-implanted through a top surface of the supporting substrate.

11 Claims, 12 Drawing Sheets

THIN FILM STRUCTURE AND METHOD OF FABRICATING THE SAME

TECHNICAL FIELD

The present invention relates to a thin film structure and a method of fabricating the same and, more particularly, a thin film structure including an epilayer formed of gallium nitride (GaN), and a method of fabricating the same.

BACKGROUND ART

Growth of high-quality single-crystal gallium nitride (GaN) is essential for optoelectronic and high-power device applications. Native GaN substrates are not commercially available for GaN homoepitaxy, because of the low solubility of nitrogen in bulk gallium (Ga). Thus, GaN-based device structures are currently grown by heteroepitaxy on a variety of foreign substrates, including sapphire, silicon carbide (SiC) or the like. Of the substrates suggested, sapphire remains the most widely used substrate because of its hexagonal symmetry and thermal stability at high temperatures during GaN growth. However, threading dislocations (TDs) and stacking faults generated due to lattice mismatches between sapphire and GaN cause a high density of defects in epitaxial GaN. To reduce the defect density, various techniques of lateral epitaxy (e.g., epitaxial lateral overgrowth (ELOG)) have been suggested. As such, the density of TDs can be reduced to $10^6$ cm$^{-2}$ or lower. However, such a density value is still much higher than that for gallium arsenide (GaAs) homoepitaxy ($10^2$ cm$^{-2}$ to $10^4$ cm$^{-2}$).

DETAILED DESCRIPTION OF THE INVENTION

Technical Problem

The present invention provides a thin film structure capable of remarkably reducing a defect density of gallium nitride (GaN), and a method of fabricating the same. However, the above technical problem is merely exemplary and the scope of the present invention is not limited thereto.

Technical Solution

According to an aspect of the present invention, there is provided a thin film structure including a supporting substrate configured to include a first material, an intermediate layer disposed on the supporting substrate and configured to include the first material and a second material, and an epilayer disposed on the intermediate layer and configured to include a third material, wherein the bulk modulus of the second material is smaller than the bulk modulus of the first material and the bulk modulus of the third material, and the shear modulus of the intermediate layer is smaller than the shear modulus of the supporting substrate and the shear modulus of the epilayer.

The intermediate layer may be elastically softer than the epilayer to accommodate dislocations generated due to lattice mismatches between the first material and the third material.

The first material may include sapphire, the second material may include silicon (Si), and the third material may include gallium nitride (GaN). The intermediate layer may include a Si-diffused sapphire layer or a Si-ion-implanted sapphire layer.

According to another aspect of the present invention, there is provided a thin film structure including a supporting substrate configured to include a first material, a compliant layer disposed on the supporting substrate and configured to include the first material and a second material, and an epilayer disposed on the compliant layer and configured to include a third material, wherein the elastic stiffness of the compliant layer is lower than the elastic stiffness of the epilayer.

The elastic stiffness of the compliant layer may be lower than the elastic stiffness of the supporting substrate.

The first material may include sapphire, the second material may include silicon (Si), and the third material may include gallium nitride (GaN). The compliant layer may include a Si-diffused sapphire layer or a Si-ion-implanted sapphire layer.

According to another aspect of the present invention, there is provided a thin film structure including a supporting substrate including sapphire, and an epilayer disposed on the supporting substrate and including gallium nitride (GaN), wherein an upper part of the supporting substrate facing the epilayer includes a layer of the sapphire into which silicon (Si) is diffused or ion-implanted through a top surface of the supporting substrate.

The silicon (Si) may be dissolved in the sapphire as an impurity without forming an intermediate phase.

According to another aspect of the present invention, there is provided an electromagnetic device using the above thin film structure. The electromagnetic device may include at least one selected from the group consisting of a thin film device, a nano device, a semiconductor device, a memory device, a molecular device, an optical device, a photoelectric device, a display device and a digital device.

According to another aspect of the present invention, there is provided a method of fabricating a thin film structure, the method including providing a supporting substrate configured to include a first material, forming a temporary layer configured to include a second material, on the supporting substrate, and forming an epilayer configured to include a third material, on the temporary layer, wherein, while the epilayer including the third material is being formed on the temporary layer, the second material of the temporary layer is diffused through a top surface of the supporting substrate to form an to intermediate layer configured to include the first material and the second material, at an upper part of the supporting substrate, and wherein the bulk modulus of the second material is smaller than the bulk modulus of the first material and the bulk modulus of the third material, and the shear modulus of the intermediate layer is smaller than the shear modulus of the supporting substrate and a shear modulus of the epilayer.

The first material may include sapphire, the second material may include silicon (Si), and the third material may include gallium nitride (GaN).

According to another aspect of the present invention, there is provided a method of fabricating a thin film structure, the method including providing a supporting substrate configured to include a first material, forming an intermediate layer configured to include the first material and a second material, at an upper part of the supporting substrate by ion-implanting the second material through a top surface of the supporting substrate, and forming an epilayer configured to include a third material, on the intermediate layer, wherein the bulk modulus of the second material is smaller than the bulk modulus of the first material and the bulk modulus of the third material, and the shear modulus of the intermediate layer is smaller than the shear modulus of the supporting substrate and the shear modulus of the epilayer.

The first material may include sapphire, the second material may include silicon (Si), and the third material may include gallium nitride (GaN).

According to another aspect of the present invention, there is provided a method of fabricating a thin film structure, the method including providing a supporting substrate configured to include sapphire, forming a temporary layer configured to include silicon (Si), on the supporting substrate, and forming an epilayer configured to include gallium nitride (GaN), on the temporary layer, wherein, while the epilayer is being formed, the silicon (Si) is diffused from the temporary layer through a top surface of the supporting substrate to form a Si-diffused layer at an upper part of the supporting substrate.

The temporary layer may be a silicon oxide ($SiO_2$) layer or a silicon (Si) layer.

The gallium nitride (GaN) may have a wurtzite crystal structure.

According to another aspect of the present invention, there is provided a method of fabricating a thin film structure, the method including providing a supporting substrate configured to include sapphire, forming a silicon (Si)-ion-implanted layer at an upper part of the supporting substrate by ion-implanting silicon (Si) through a top surface of the supporting substrate, and forming an epilayer configured to include gallium nitride (GaN), on the Si-ion-implanted layer.

Advantageous Effects

According to embodiments of the present invention, a thin film structure capable of remarkably reducing a defect density of gallium nitride (GaN), and a method of is fabricating the same may be provided. However, the scope of the present invention is not limited to the above effect.

Figure 7:
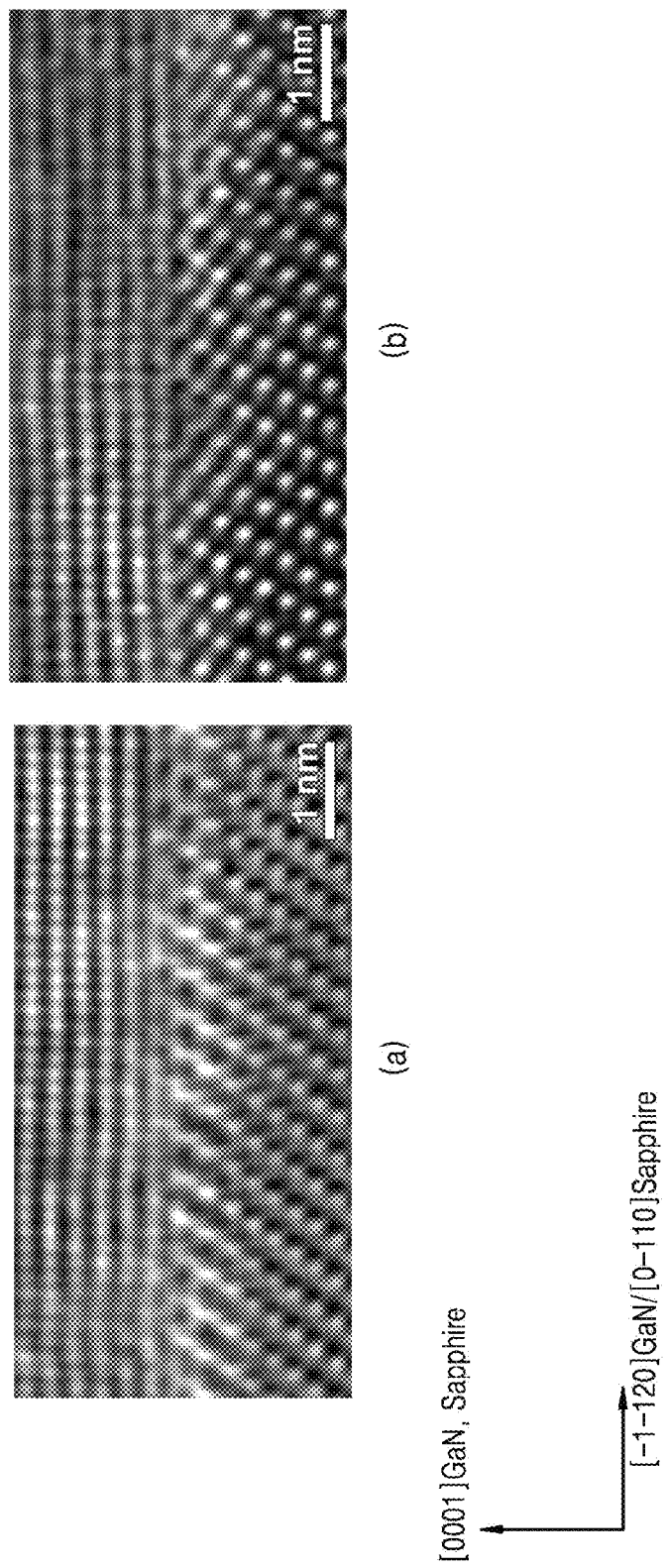

(a) of FIG. 7 is a high-resolution transmission electron microscopy (TEM) image of a GaN/sapphire interface between a bare sapphire substrate and GaN formed directly thereon in the thin film structure fabricating method according to a comparative example of the present invention.

(b) of FIG. 7 is a high-resolution TEM image of an interface of GaN formed on the silicon oxide layer/sapphire substrate in the thin film structure fabricating method according to an embodiment of the present invention.

Figure 8:
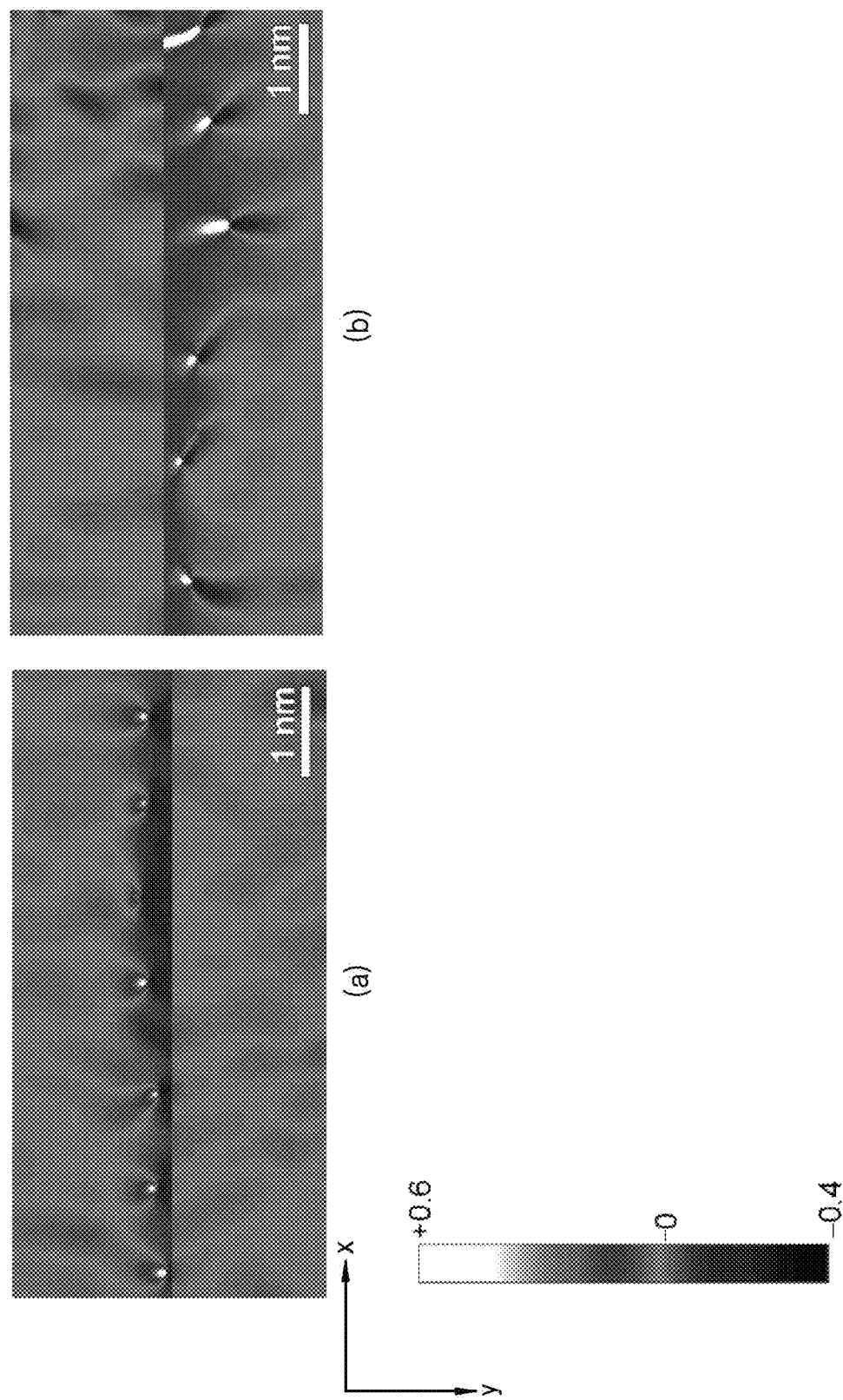

(a) of FIG. 8 is a strain map of $\epsilon_{xx}$ corresponding to (a) of FIG. 7 and obtained by geometric phase analysis (GPA).

(b) of FIG. 8 is a strain map of $\epsilon_{xx}$ corresponding to FIG. (b) of 7 and obtained by GPA.

MODE OF THE INVENTION

Hereinafter, embodiments of the present invention will be described in detail with reference to the accompanied drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and to the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a", "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

Figure 1:
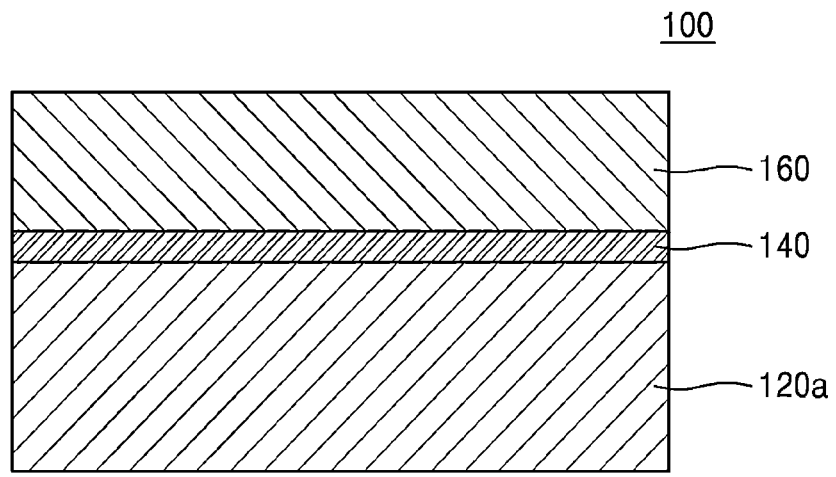
FIG. 1 is a cross-sectional diagram of a thin film structure according to an embodiment of the present invention.

FIG. 1 is a cross-sectional diagram of a thin film structure 100 according to an embodiment of the present invention.

Referring to FIG. 1, the thin film structure 100 according to an embodiment of the present invention includes a supporting substrate 120a, an intermediate layer 140 disposed on the supporting substrate 120a, and an epilayer 160 disposed on the intermediate layer 140. The supporting substrate 120a may be configured to include a first material, the intermediate layer 140 may be configured to include a second material, and the epilayer 160 may be configured to include a third material. Here, the bulk modulus of the second material may be smaller than the bulk modulus of the first material and/or the bulk modulus of the third material. Furthermore, the shear modulus of the intermediate layer 140 may be smaller than the shear modulus of the supporting substrate 120a and/or the shear modulus of the epilayer 160.

Meanwhile, the elastic stiffness of the intermediate layer 140 may be lower than the elastic stiffness of the epilayer 160. Furthermore, the elastic stiffness of the intermediate layer 140 may be lower than the elastic stiffness of the supporting substrate 120a and the epilayer 160.

In the thin film structure 100 according to an embodiment of the present invention, the intermediate layer 140 may be elastically softer than the epilayer 160 to accommodate dislocations generated due to lattice mismatches between the supporting substrate 120a configured to include the first material and the epilayer 160 configured to include the third material. Therefore, the thin film structure 100 according to an embodiment of the present invention may reduce a defect density in the epilayer 160 by configuring the intermediate layer 140, instead of the epilayer 160, to accommodate at least part of the defects generated due to lattice mismatches between the supporting substrate 120a and the epilayer 160.

Since the intermediate layer 140 can control the strain of a lattice mismatch structure, reduce a defect density of the epilayer 160, and accommodate lattice mismatches, the intermediate layer 140 may be understood as a compliant layer or a compliant substrate in the thin film structure 100 according to an embodiment of the present invention.

In the thin film structure 100 according to an embodiment of the present invention, the first material may include α-$Al_2O_3$, i.e., sapphire, the second material may include silicon (Si), and the third material may include gallium nitride (GaN). Here, the intermediate layer 140 may be a Si-diffused sapphire layer or a Si-ion-implanted sapphire layer. In the intermediate layer 140, Si may be present in sapphire as an impurity without separately forming an intermediate phase or a second phase. For example, Si may be dissolved in sapphire at a very low density in the intermediate layer 140.

Referring to FIG. 1, the thin film structure 100 according to another embodiment of the present invention includes the supporting substrate 120a configured to include the first material, and the epilayer 160 disposed on the supporting substrate 120a and configured to include the third material. The intermediate layer 140 disposed between the supporting substrate 120a and the epilayer 160 and configured to include the second material may be formed at an upper part 120p of a supporting substrate 120 (see FIG. 2). That is, the intermediate layer 140 may be formed by diffusing or ion-implanting the second material through a top surface 120s of the supporting substrate 120 into the upper part 120p. The role of the intermediate layer 140 and the types and properties of the first to third materials have already been described above and therefore descriptions thereof will be omitted.

Figure 2A:
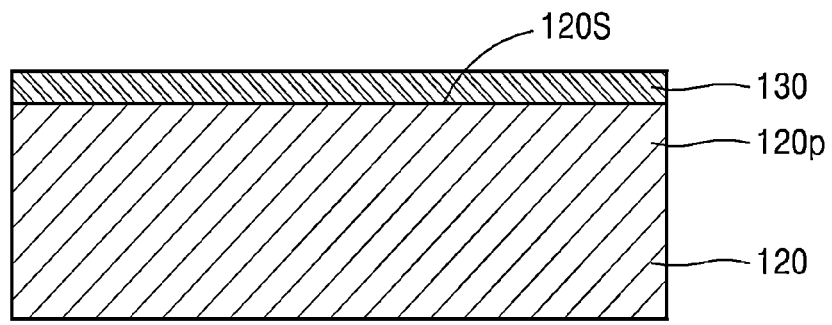
FIGS. 2A and 2B are cross-sectional diagrams for describing a method of fabricating the thin film structure according to an embodiment of the present invention.
Figure 2B:
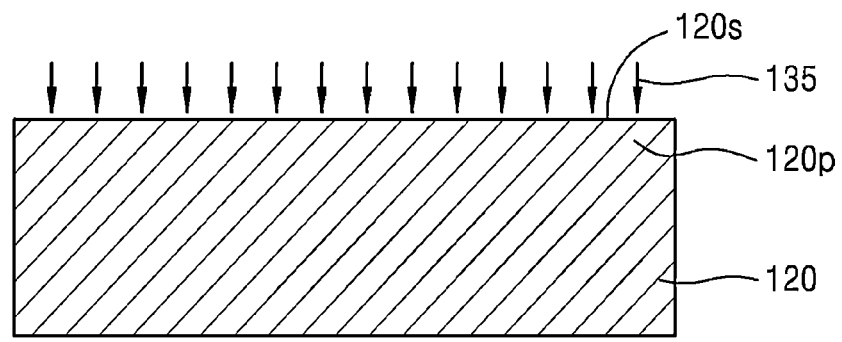

FIGS. 2A and 2B are cross-sectional diagrams for describing a method of fabricating the thin film structure 100 according to an embodiment of the present invention.

Referring to FIGS. 1 and 2A, the method of fabricating the thin film structure 100 according to an embodiment of the present invention includes providing the supporting substrate 120 configured to include the first material, forming a temporary layer 130 configured to include the second material, on the supporting substrate 120, and forming the epilayer 160 configured to include the third material, on the temporary layer 130.

Here, the bulk modulus of the second material may be smaller than the bulk modulus of the first material and/or the bulk modulus of the third material. Further, the shear modulus of the intermediate layer 140 may be smaller than the shear modulus of the supporting substrate 120a and/or the shear modulus of the epilayer 160.

While the epilayer 160 including the third material is being formed on the temporary layer 130 at several hundred to several thousand degrees Celsius, the second material of the temporary layer 130 may be diffused through the top surface 120s of the supporting substrate 120 to form the intermediate layer 140 configured to include the second material, at the upper part 120p of the supporting substrate 120. In this process, at least part of the temporary layer 130 may be transformed into the intermediate layer 140 or disappear. That is, the temporary layer 130 may be present only in an intermediate step of the method of fabricating the thin film structure 100 and may not be present in the final thin film structure 100.

The first material may include α-$Al_2O_3$, i.e., sapphire, the second material may include Si, and the third material may include GaN. Here, the temporary layer 130 may to include a silicon oxide ($SiO_2$) layer. For example, at least part of a process of forming gallium nitride (GaN) by metal-organic chemical vapor deposition (MOCVD) may be performed at a high temperature and, in this process, silicon (Si) in the silicon dioxide ($SiO_2$) of the temporary layer 130 may be diffused through the top surface 120s of the supporting substrate 120 into the upper part 120p of the supporting substrate 120 to form the intermediate layer 140 configured to include silicon (Si), at the upper part 120p of the supporting substrate 120.

Meanwhile, according to a modified embodiment of the present invention, a silicon (Si) layer may be formed as the temporary layer 130 by electrodeposition or vapor deposition. Then, at least part of a process of forming GaN by MOCVD may be performed at a high temperature and, in this process, Si of the Si layer formed as the temporary layer 130 may be diffused through the top surface 120s of the supporting substrate 120 into the upper part 120p of the supporting substrate 120 to form the intermediate layer 140 configured to include Si, at the upper part 120p of the supporting substrate 120.

Referring to FIGS. 1 and 2B, the method of fabricating the thin film structure 100 according to another embodiment of the present invention may include providing the supporting substrate 120 configured to include the first material, forming the intermediate layer 140 configured to include the second material, at the upper part 120p of the supporting substrate 120 by ion-implanting (135) the second material through the top surface 120s of the supporting substrate 120, and forming the epilayer 160 configured to include the third material, on the intermediate layer 140. In this embodiment, since the intermediate layer 140 is formed by directly ion-implanting (135) the second material into the upper part 120p of the supporting substrate 120 without additionally using the temporary layer 130, unlike FIG. 2A, the intermediate layer 140 may have been formed before the epilayer 160 is formed. A concentration profile of the second material in the intermediate layer 140 may be appropriately controlled by changing the condition of the ion-implantation process. The role of the intermediate layer 140 and the types and properties of the first to third materials have been described above and thus descriptions thereof will be omitted.

Meanwhile, the above-described thin film structure 100 may be applied to a variety of electromagnetic devices. For example, the electromagnetic devices may include at least one selected from the group consisting of a thin film device, a nano device, a semiconductor device, a memory device, a molecular device, an optical device, a photoelectric device, a display device and a digital device.

A description of detailed embodiments is now provided for better understanding of the present invention. However, the following embodiments are merely illustrative and is the present invention is not limited thereto.

Figure 3A:
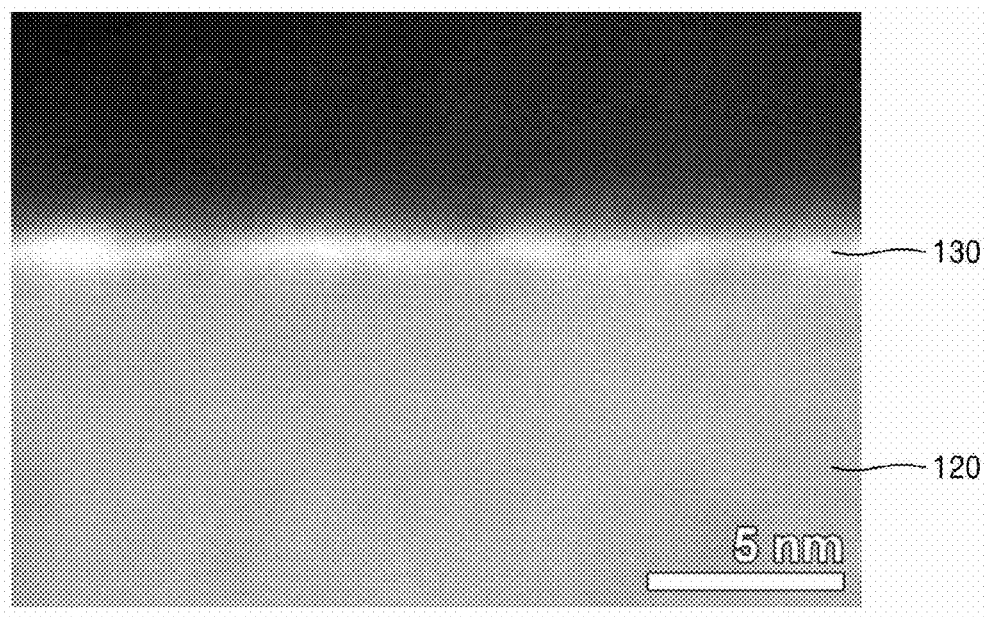
FIG. 3A is an image of a structure in which a silicon oxide layer is formed on a sapphire substrate in the thin film structure fabricating method according to an embodiment of the present invention.
Figure 3B:
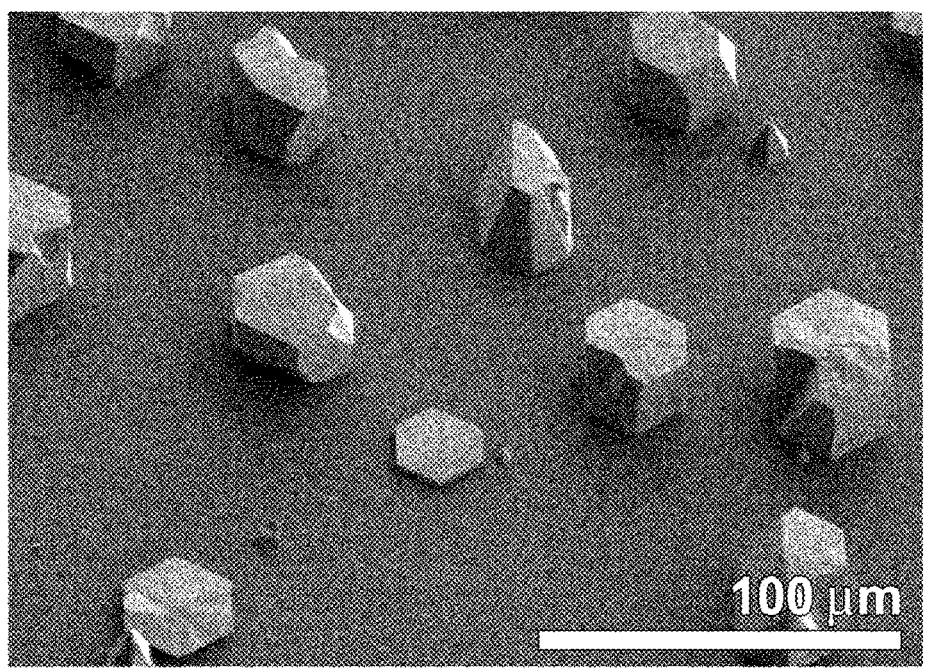
FIG. 3B is an image of gallium nitride (GaN) formed on the silicon oxide layer/sapphire substrate structure in the thin film structure fabricating method according to an embodiment of the present invention.
Figure 3C:
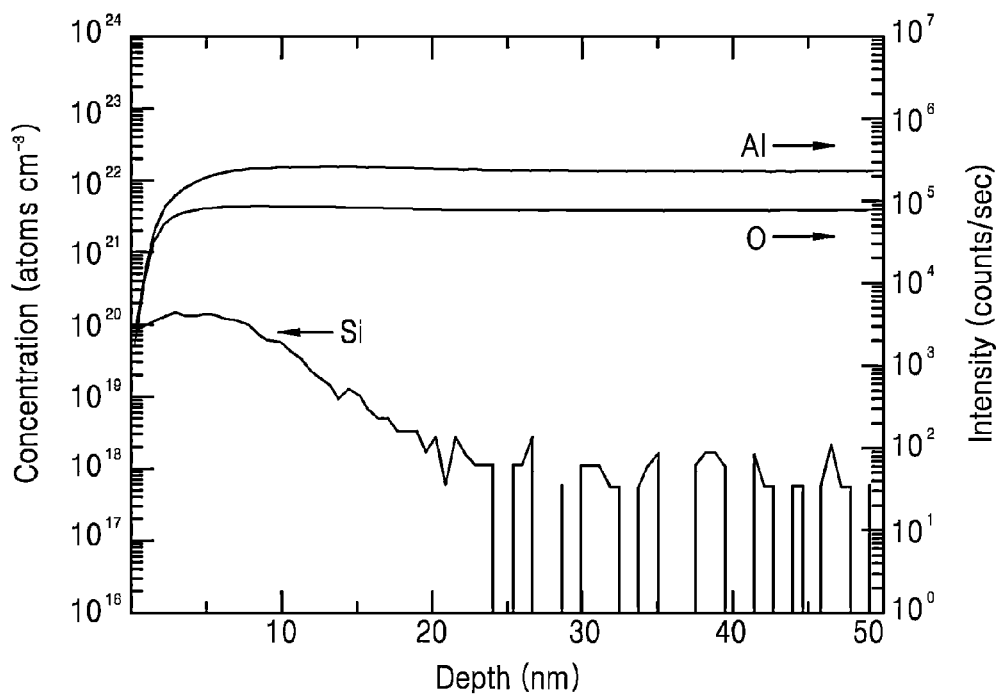
FIG. 3C is a graph showing a result of measuring the concentration of silicon (Si) in sapphire after GaN is formed in the thin film structure fabricating method according to an embodiment of the present invention.

FIG. 3A is a high angle annular dark field (HAADF)-scanning transmission electron microscopy (STEM) image of a structure in which a silicon oxide layer is formed on a sapphire substrate by atomic layer deposition (ALD) in the thin film structure fabricating method according to an embodiment of the present invention, FIG. 3B is a scanning electron microscopy (SEM) image of GaN formed on the silicon oxide layer/sapphire substrate structure in the thin film structure fabricating method according to an embodiment of the present invention, and FIG. 3C is a graph showing a secondary ion mass spectrometry (SIMS) profile obtained by measuring the concentration of Si in sapphire after GaN is formed by metal organic chemical vapor deposition (MOCVD) in the thin film structure fabricating method according to an embodiment of the present invention.

Referring to FIG. 3A, before GaN is formed by MOCVD, a silicon oxide layer 130 having a nominal thickness of 0.5 nm is formed by ALD on a sapphire substrate 120. The silicon oxide layer 130 corresponds to the temporary layer 130 illustrated in FIG. 2A. The image of FIG. 3A shows an area where the thickness of the silicon oxide layer 130 is 0.53±0.1 nm but the thickness is not uniform.

Referring to FIG. 3B, it is shown that some of GaN formed by MOCVD has a hexagonal pyramid structure and includes hexagonal columns having various heights within a range from 200 nm to 10 µm.

Interestingly, a silicon oxide layer 130 such as the one shown in FIG. 3A was not observed after GaN was formed by MOCVD. Instead, as shown in FIG. 3C, a secondary ion mass spectrometry (SIMS) showed that a thin layer including a small amount of Si was formed at an upper part of the sapphire substrate 120. The SIMS was performed for an area that is not covered by the GaN columns. The right vertical axis of the graph indicates units for the profile of aluminum (Al) and oxygen (O), and the left vertical axis indicates units for the profile of silicon (Si). Referring to FIG. 3C, the concentration of Si on the surface is about $10^{20}$ $cm^{-3}$ with its maximum concentration of $1.68 \times 10^{20}$ $cm^{-3}$ at a depth of 2.9 nm. Considering that the concentration of sapphire is about $1.17 \times 10^{23}$ $cm^{-3}$, the concentration of Si on the surface corresponds to 0.085 at %.

Figure 4A:
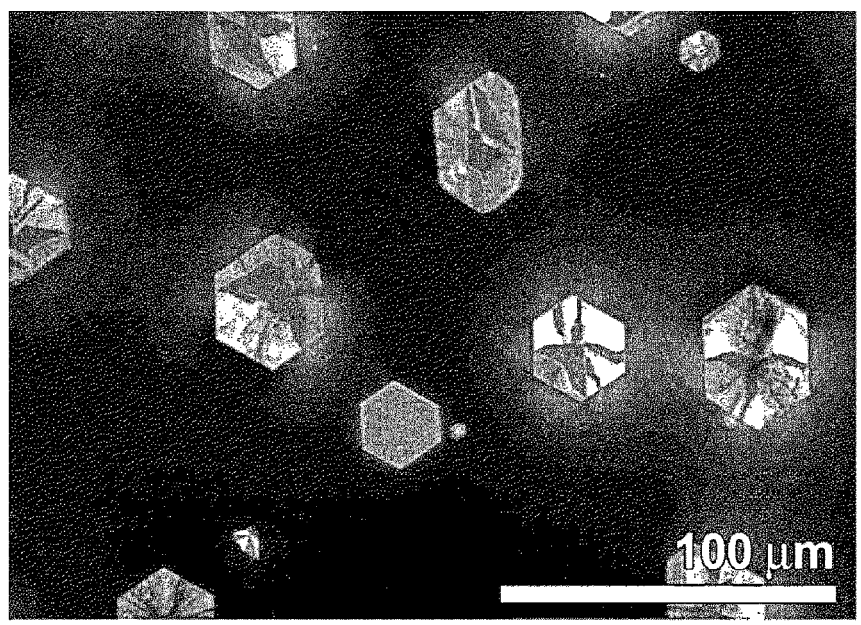
FIGS. 4A to 4E are images of GaN columns in the thin film structure according to an embodiment of the present invention.
Figure 4B:
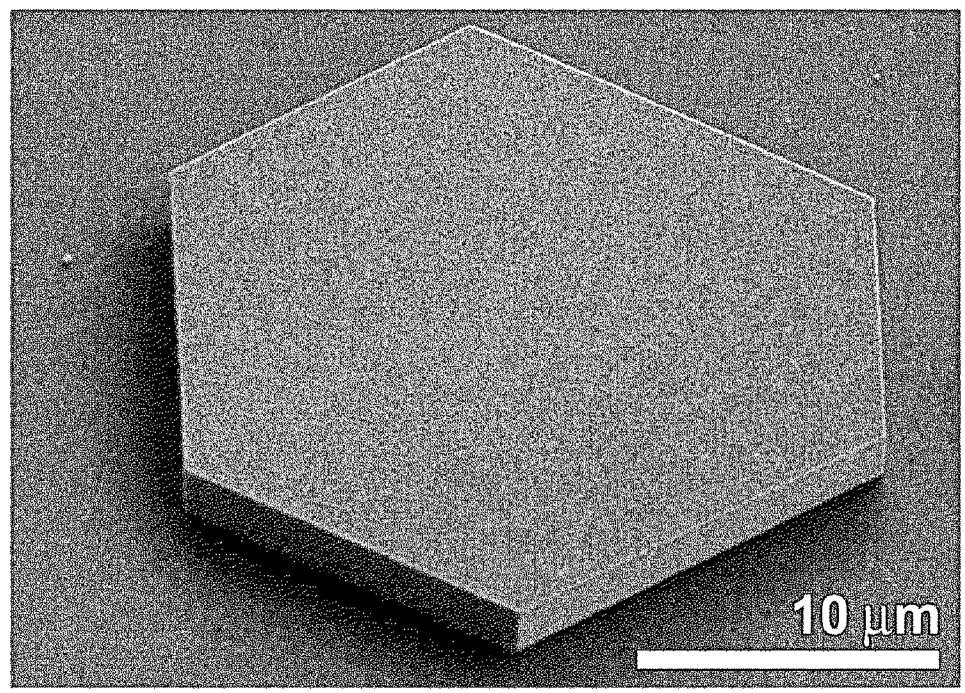
Figure 4C:
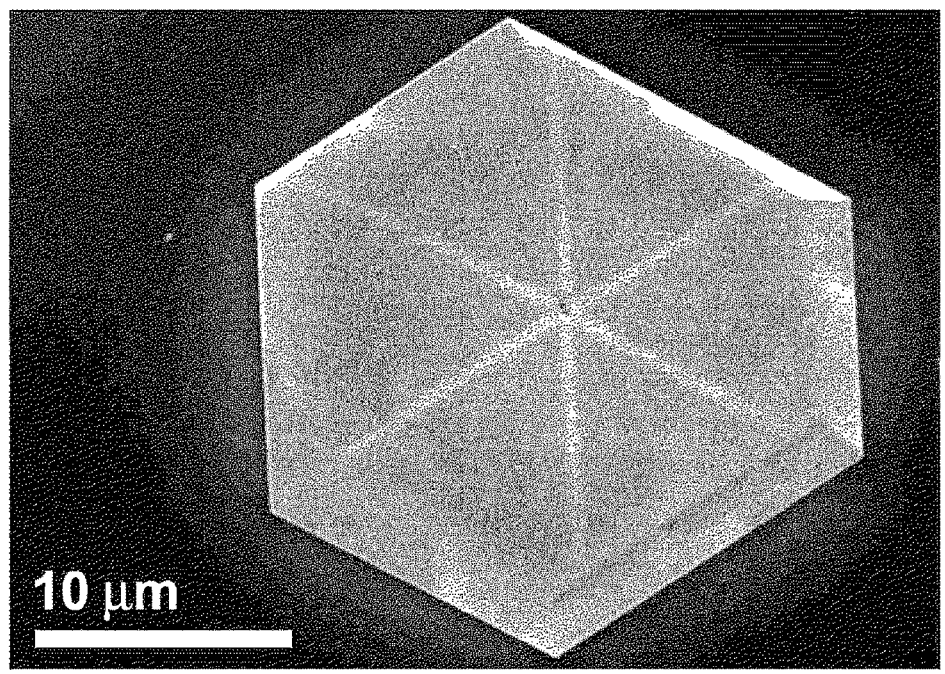
Figure 4D:
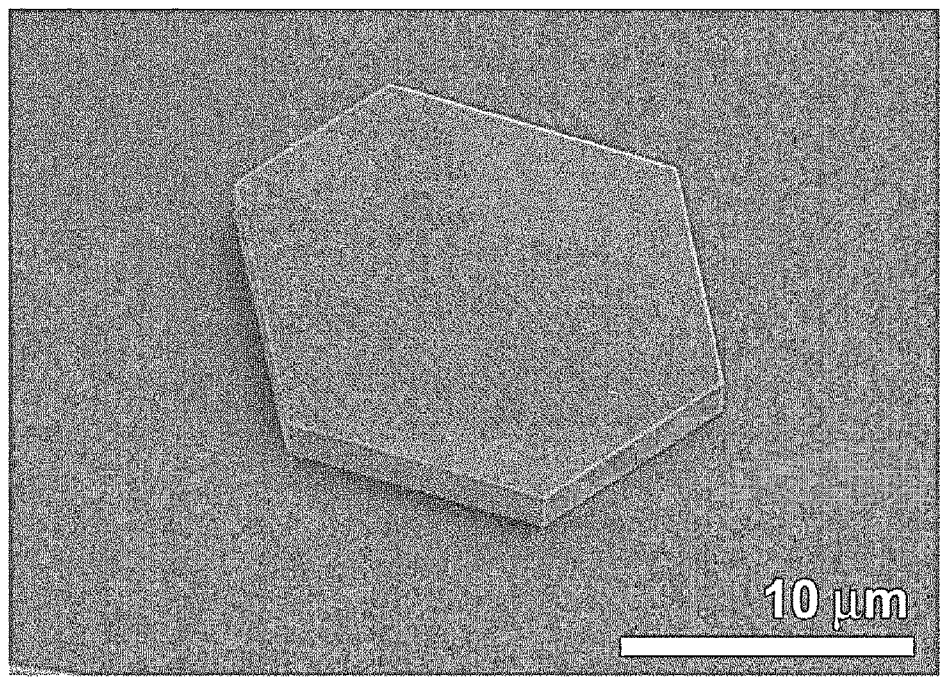
Figure 4E:
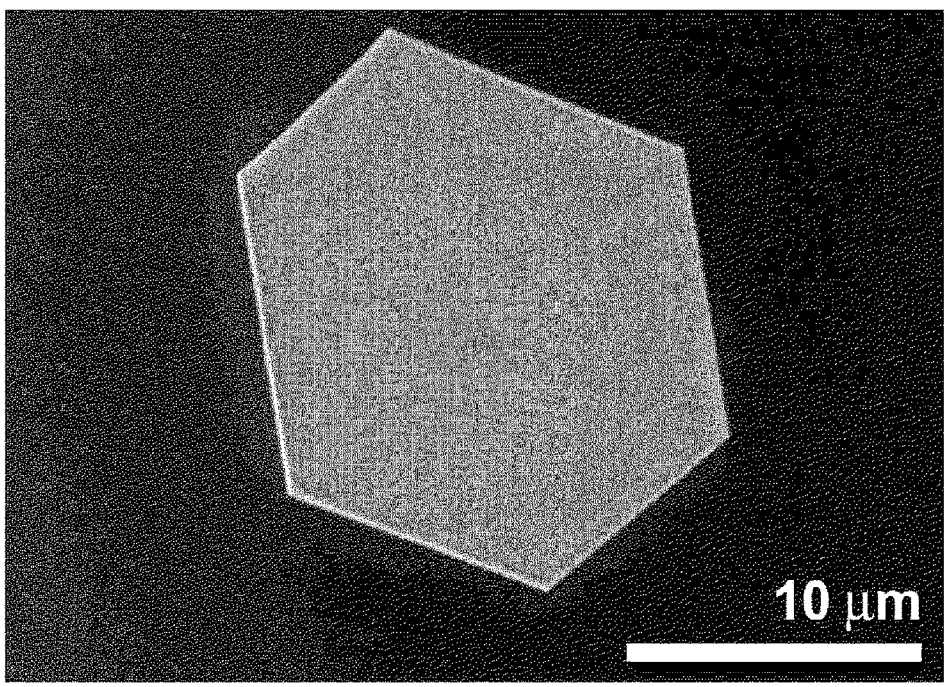

FIGS. 4A to 4E are images of GaN columns in the thin film structure according to is an embodiment of the present invention. Specifically, FIG. 4A is a panchromatic cathodoluminescence (CL) image obtained from the same region shown in FIG. 3A, FIG. 4B is an SEM image obtained by magnifying a low column of FIG. 4A in a tilted view, FIG. 4C is a cathodoluminescence image corresponding to FIG. 4B, FIG. 4D is an SEM image of another column in a tilted view, and FIG. 4E is a cathodoluminescence image corresponding to FIG. 4D. GaN columns are hexagonal columns each having an almost (0001) top surface and {1-100} facets.

Referring to FIG. 4B, some lower GaN hexagonal columns are 400 nm to 1.2 µm in height and 5 µm to 30 µm in length. Dark spot contrasts shown in FIG. 4C may correspond to threading dislocations (TDs) or other types of line defects. Defects in GaN were rarely observed as shown in FIG. 4C or no defects were observed as shown in FIG. 4E. This means that GaN contains almost no dislocations. The striking result is also confirmed by transmission electron microscopy (TEM).

Figure 5A:
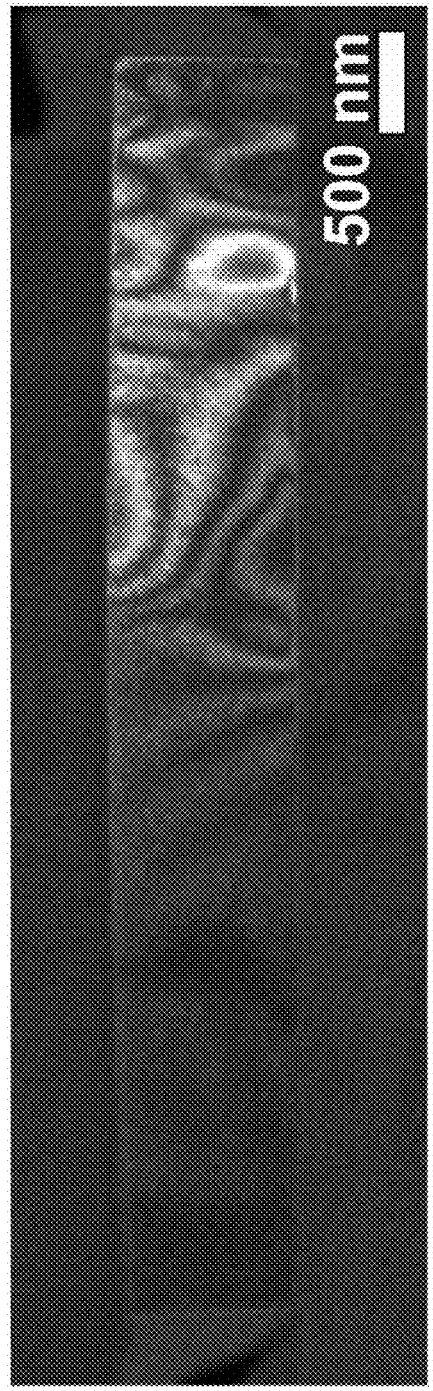
FIGS. 5A and 5B are images of GaN in the thin film structure according to an embodiment of the present invention.
Figure 5B:
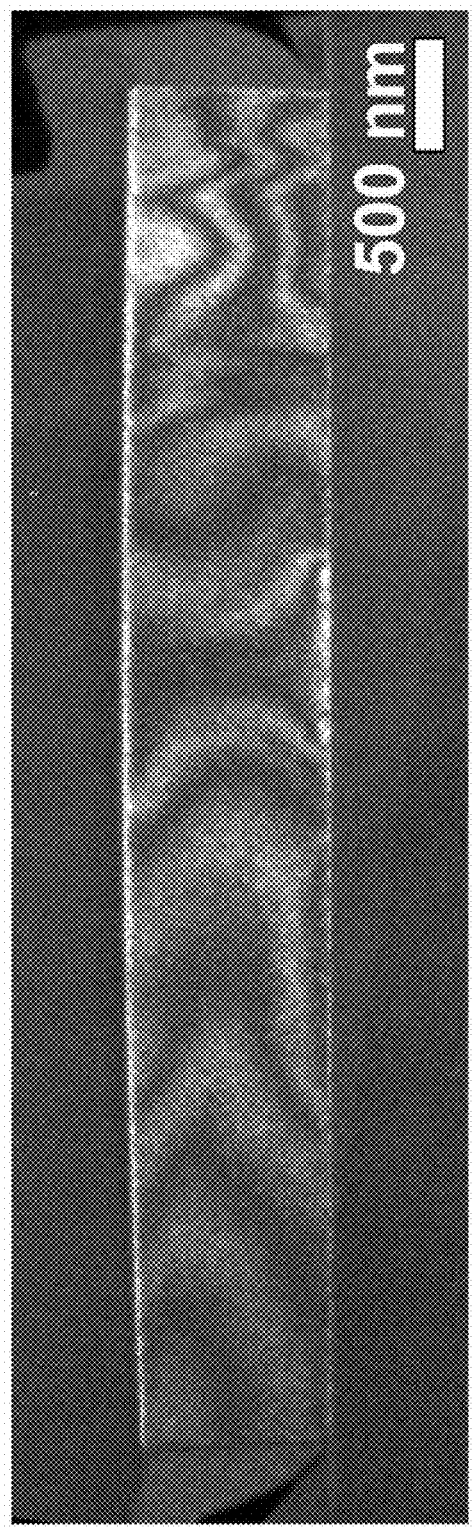

FIGS. 5A and 5B are images of GaN in the thin film structure according to an embodiment of the present invention. Particularly, FIGS. 5A and 5B are weak-beam dark-field images (g-3 g) of a GaN column taken near the [−2110] zone axis under the condition of g=0-110 and g=0002, respectively. FIG. 5C is a cross-section transmission electron microscopy (XTEM) image of the same GaN column taken near the [−2110] zone axis.

Referring to FIGS. 5A and 5B, defects and defect densities may be observed and measured using the g-3g weak-beam dark-field cross-section transmission electron microscopy (XTEM) images of GaN taken near the [−2110] zone axis under the condition of g=0-110 and g=0002. However, no defects were observed in any of the columns.

To measure local strain components near the GaN/sapphire interface, geometric phase analysis (GPA) and TEM strain mapping may be employed. For comparison with the silicon oxide layer/sapphire substrate according to an embodiment of the present invention, GaN was formed directly on a bare sapphire substrate according to a comparative example of the present invention.

FIGS. 6A to 6D are images of a structure in which GaN is formed directly on a sapphire substrate in a thin film structure fabricating method according to a comparative example of the present invention.

Figure 6A:
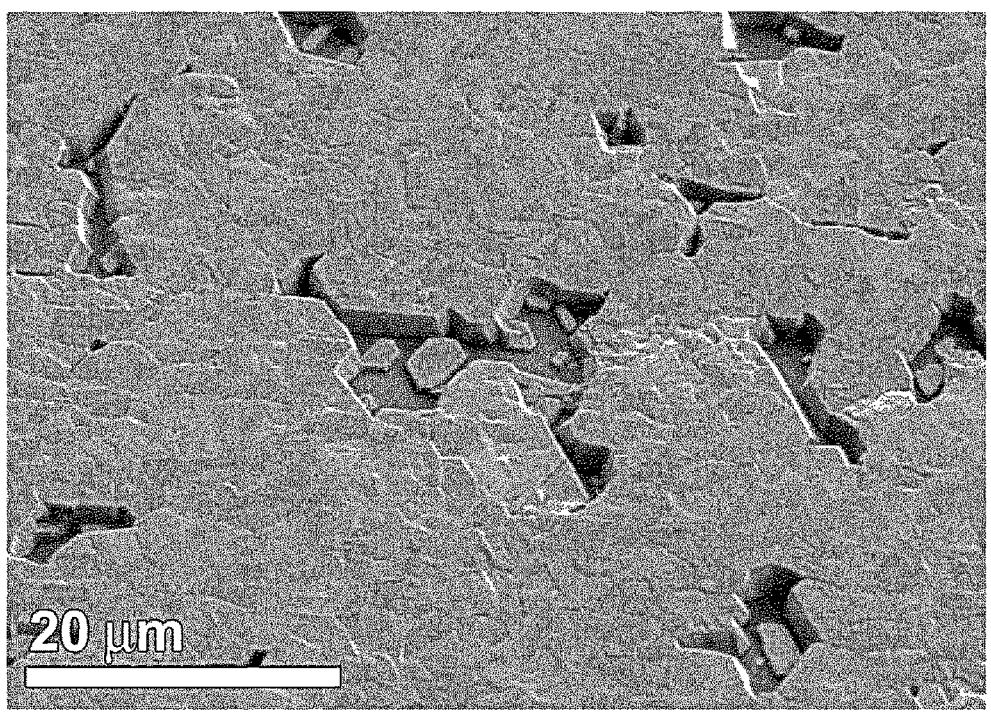
FIGS. 6A to 6D are images of a structure in which GaN is formed directly on a sapphire substrate in a thin film structure fabricating method according to a comparative example of the present invention.
Figure 6B:
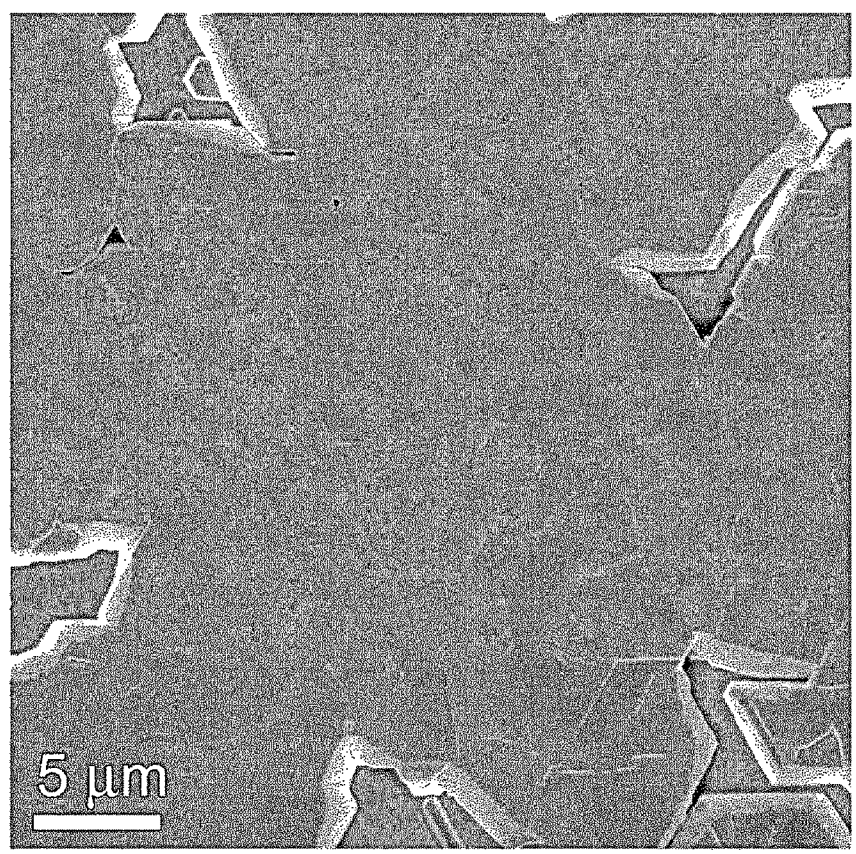
Figure 6C:
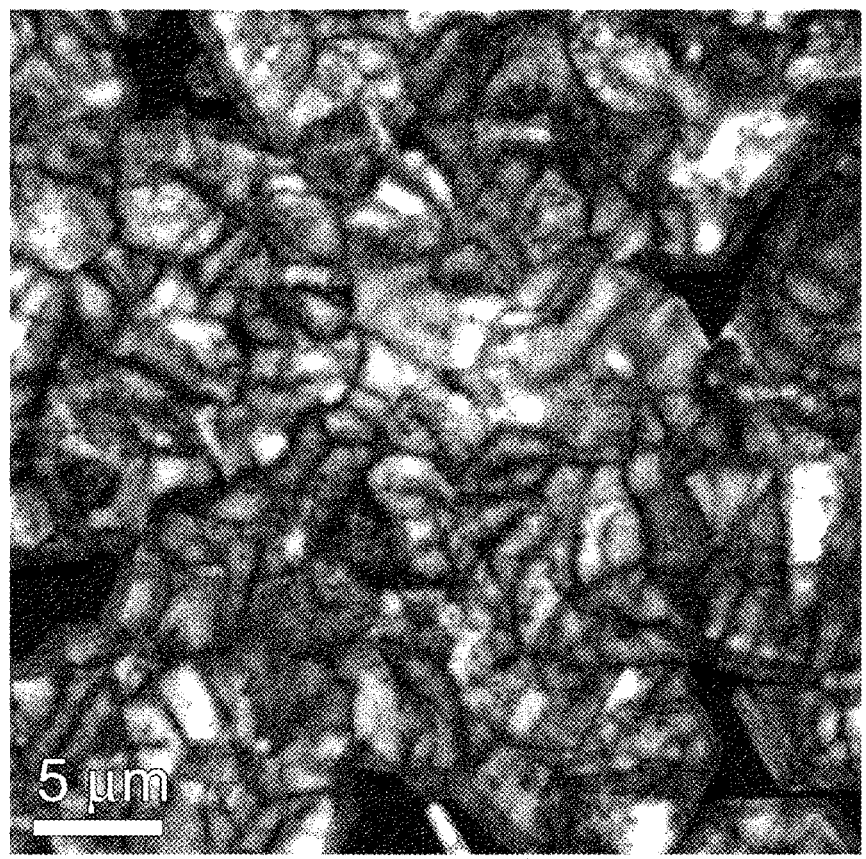

Referring to FIG. 6A, GaN that is formed directly on the sapphire substrate has a film morphology. Referring to FIGS. 6B and 6C, GaN that is formed directly on the sapphire substrate contains a high density of defects.

Figure 6D:
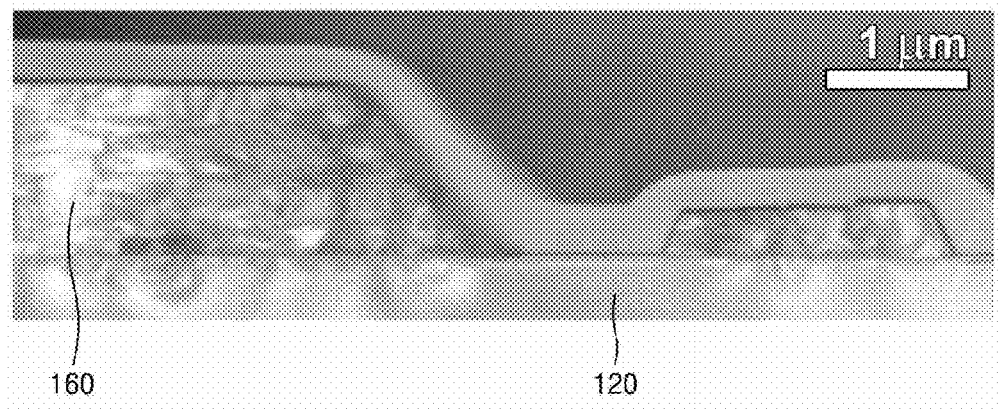

FIG. 6D is an XTEM image of a GaN layer 160 that is vapor-deposited on a bare sapphire substrate 120, which is taken along the [−2110] zone axis. A weak-beam dark-field image of the regions of the GaN layer 160 of FIG. 6D shows that the GaN layer 160 contains high densities of threading dislocations and stacking faults. For example, basal edges, mixed dislocations, nanopipes and stacking faults can be observed in the weak-beam dark-field image.

(a) of FIG. 7 is a high-resolution TEM image of a GaN/sapphire interface between a bare sapphire substrate and GaN formed directly thereon in the thin film structure fabricating method according to a comparative example of the present invention, and (b) of FIG. 7 is a high-resolution TEM image of an interface of GaN formed on the silicon oxide layer/sapphire substrate in the thin film structure fabricating method according to an embodiment of the present invention. In FIG. 7, a lower part of the interface includes sapphire and an upper part of the interface includes GaN.

(a) of FIG. 8 is a strain map of $\epsilon_{xx}$ corresponding to (a) of FIG. 7 and obtained by GPA, and (b) of FIG. 8 is a strain map of $\epsilon_{xx}$ corresponding to (b) of FIG. 7 and obtained by GPA. In FIG. 8, the x direction is parallel to the interface and the y direction is perpendicular to the interface. The bar indicates the full strain range from −0.4 to 0.6.

Referring to (a) of FIG. 7 and (a) of FIG. 8, for the bare sapphire substrate, misfit dislocations (MDs) are toward the GaN away from the GaN/sapphire interface. In contrast, referring to (b) of FIG. 7 and (b) of FIG. 8, for the Si-diffused sapphire substrate, MDs recede toward the sapphire. Referring to FIG. 8, the strain map of $\epsilon_{xx}$ indicates the exact location of the cores of the dislocations.

Referring to (a) of FIG. 8, the spacing between the dislocations in GaN is 1.01±0.13 nm and the distance from the interface to the dislocations is about 0.21±0.1 nm. Referring to (b) of FIG. 8, the spacing between the dislocations in sapphire is 1.21±0.18 nm and the distance from the interface to the dislocations is about 0.45±0.18 nm.

As described above, taking into account that GaN on the bare sapphire substrate had a film morphology (see FIG. 6A, for example) and that on the silicon oxide/sapphire substrate had an island structure (see FIG. 3B, for example), it can be inferred that the ratio of the interface energy to the surface energy is reduced by the Si diffusion, thereby delaying the nucleation of GaN. Therefore, GaN tends to nucleate faster in Si-poor regions than in Si-rich regions, leading to non-uniform heights of GaN columns, as shown in FIG. 3B. The inventors confirmed that the higher columns of GaN, which had high concentrations of defects, nucleated in Si-poor regions, whereas the lower columns of GaN contained no or almost no dislocations and were created from relatively Si-rich regions.

The misfit at an interface between two crystalline phases is accommodated by MDs at the interface. However, if the shear moduli of two crystals are different from each other, MDs move to the region with a lower modulus having a space from the interface, because the dislocation energy is lowered in the more compliant region.

In the case of epitaxial c-GaN on c-plane sapphire, their shear moduli for their c-planes can be compared. First of all, the elastic compliances of the two materials can be compared as described below. For sapphire ($\alpha$-$Al_2O_3$), $S_{11}$=0.002351, $S_{33}$=0.002173, $S_{44}$=0.006941, $S_{12}$=−0.0006992, $S_{13}$=−0.0003857, and $S_{14}$=0.0004745 (in $GPa^{-1}$) at 298K. For GaN having a wurtzite crystal structure, $S_{11}$=0.003196, $S_{33}$=0.002764, $S_{44}$=0.010684, $S_{12}$=−0.001115, and $S_{13}$=−0.0004323 (in $GPa^{-1}$). From the above compliances of the two materials, the shear moduli (=$1/S_{44}$) of c-GaN and sapphire on their basal planes, which prove to be independent of the shear directions on their basal planes, are 94 GPa and 144 GPa, respectively, which indicates that GaN is more compliant than sapphire. MDs move from the interface toward the GaN because GaN having a wurtzite crystal structure has a smaller shear modulus on the basal plane than the sapphire for the bare sapphire.

Comparatively, the shear modulus of sapphire to which a small amount of Si is added is smaller than the shear modulus of pure sapphire. In addition, the shear modulus of sapphire to which a small amount of Si is added is smaller than the shear modulus of GaN on the sapphire to which a small amount of Si is added. As such, MDs recede from GaN toward sapphire to which a small amount of Si is added (for example, Si-diffused or Si-ion-implanted sapphire).

The compliances of Si is higher than those of sapphire, although the symmetry (cubic symmetry) of Si is different from that (trigonal symmetry) of sapphire. That is, Si has values of $S_{11}$=0.007685, $S_{44}$=0.012563, $S_{12}$=−0.002139 (in $GPa^{-1}$) at 298K and therefore the bulk moduli of Si is calculated by a formula of $[3(S_{11}+2S_{12})]^{-1}$ to be 98 GPa and that of sapphire is calculated by a formula of $[2(S_{11}+S_{12}+2S_{13})+S_{33}]^{-1}$ to be 254 GPa. This indicates that Si is more compliant than sapphire. In other words, Si is elastically softer than sapphire. Here, the matrix $S_{ij}$ is a matrix indicating elastic compliances and an inverse matrix thereof provides a matrix $C_{ij}$ indicating elastic stiffness.

Meanwhile, considering the symmetry (hexagonal symmetry) of GaN having a wurtzite crystal structure, GaN has values of $S_{11}$=0.003196, $S_{33}$=0.002764, $S_{44}$=0.010684, $S_{12}$=−0.001115, and $S_{13}$=−0.0004323 in $GPa^{-1}$ at 298K, and the bulk modulus of GaN is calculated by a formula of $[2(S_{11}+S_{12}+2S_{13})+S_{33}]^{-1}$ to be 192.43 GPa. This indicates that Si is more compliant than GaN. In other words, silicon is elastically softer than GaN.

For example, since the values of $S_{11}$ of Si, sapphire, and GaN are 0.007685, 0.002351, and 0.003196, respectively, Si is the softest and GaN is the second softest in terms of compliance.

It would be inferred from the above results that, if a very small amount of Si is added to sapphire as an impurity without separately forming an intermediate phase or a second phase, sapphire becomes more compliant. The Si-diffused or Si-ion-implanted sapphire surface layer can generate dislocations, thereby accommodating the large mismatches between GaN and sapphire (see (b) of FIG. 7 and (b) of FIG. 8).

For the bare sapphire substrate, although having film morphology, the GaN layer comprises small grains up to 5 μm in diameter and contains many defects (see FIGS. 6A to 6C). In contrast, for the Si-diffused or Si-ion-implanted sapphire substrate, GaN could resist the misfits and thermal stresses without generating dislocations.

The above GPA results indicate that, with the addition of a small amount of Si, sapphire becomes more compliant and thus dislocation-free GaN can be formed.

As described above, in a bare sapphire substrate, MDs move toward the GaN or are generated in the GaN since the GaN formed on the bare sapphire substrate is more compliant than that formed on a sapphire supporting substrate. Considering that at least part of the generation and/or movement of dislocations is related to shear moduli and that the shear modulus of a sapphire substrate is greater than the shear modulus of a GaN epilayer whereas the bulk modulus of Si is smaller than the bulk modulus of sapphire and the bulk modulus of GaN, the inventors introduced a compliant substrate comprising sapphire to which a small amount of Si is added (for example, Si-diffused or Si-ion-implanted sapphire) between the sapphire supporting substrate and GaN, and confirmed that the compliant substrate was more compliant than GaN and therefore MDs is moved toward the compliant substrate or were generated in the compliant substrate. The fact that the dislocations move toward the Si-added sapphire substrate rather than the GaN means that the shear modulus of the compliant substrate is smaller than the shear modulus of the supporting substrate and the shear modulus of the GaN epilayer.

While the present invention has been particularly shown and described with reference to exemplary embodiments thereof, it will be understood by one of ordinary skill in the art that various changes in form and details may be made therein without departing from the spirit and scope of the invention as defined by the following claims. The exemplary embodiments should be considered in a descriptive sense only and not for purposes of limitation. Therefore, the scope of the invention is defined not by the detailed description of the invention but by the following claims, and all differences within the scope will be construed as being included in the present invention.

The invention claimed is:

1. A thin film structure comprising:
a supporting substrate configured to comprise a first material;
an intermediate layer disposed on the supporting substrate and configured to comprise the first material and a second material; and
an epilayer disposed on the intermediate layer and configured to comprise a third material,
wherein the bulk modulus of the second material is smaller than the bulk modulus of the first material and the bulk modulus of the third material, and the shear modulus of the intermediate layer is smaller than the shear modulus of the supporting substrate and the shear modulus of the epilayer,
wherein the first material includes sapphire, the second material includes silicon (Si), and the third material includes gallium nitride (GaN), and
wherein the intermediate layer is an Si-diffused sapphire layer formed by forming a temporary layer having silicon oxide, and diffusing silicon from the silicon oxide into the supporting substrate.

2. The thin film structure of claim 1, wherein the intermediate layer is elastically softer than the epilayer to accommodate dislocations generated due to lattice mismatches between the first material and the third material.

3. A thin film structure comprising:
a supporting substrate configured to comprise a first material;
a compliant layer disposed on the supporting substrate and configured to comprise the first material and a second material; and
an epilayer disposed on the compliant layer and configured to comprise a third material,
wherein the elastic stiffness of the compliant layer is lower than the elastic stiffness of the epilayer,
wherein the first material includes sapphire, the second material includes silicon (Si), and the third material includes gallium nitride (GaN), and
wherein the intermediate layer is an Si-diffused sapphire layer formed by forming a temporary layer having silicon oxide, and diffusing silicon from the silicon oxide into the supporting substrate.

4. The thin film structure of claim 3, wherein the elastic stiffness of the compliant layer is lower than the elastic stiffness of the supporting substrate.

5. An electromagnetic device using the thin film structure according to any one of claims 1, 2, 3 and 4.

6. The electromagnetic device of claim 5, comprising at least one selected from the group consisting of a thin film device, a nano device, a semiconductor device, a memory device, a molecular device, an optical device, a photoelectric device, a display device and a digital device.

7. A method of fabricating a thin film structure, the method comprising:
providing a supporting substrate configured to comprise a first material;
forming a temporary layer on the supporting substrate, the temporary layer being configured to comprise a second material; and
forming an epilayer on the temporary layer, the epilayer being configured to comprise a third material,
wherein, while the epilayer comprising the third material is being formed on the temporary layer, the second material is diffused from the temporary layer through a top surface of the supporting substrate to form an intermediate layer at an upper part of the supporting substrate, the intermediate layer being configured to comprise the first material and the second material, and
wherein the bulk modulus of the second material is smaller than the bulk modulus of the first material and the bulk modulus of the third material, and the shear modulus of the intermediate layer is smaller than the shear modulus of the supporting substrate and the shear modulus of the epilayer.

8. The method of claim 7, wherein the first material includes sapphire, the second material includes silicon (Si), and the third material includes gallium nitride (GaN).

9. A method of fabricating a thin film structure, the method comprising:
providing a supporting substrate configured to comprise sapphire;
forming a temporary layer on the supporting substrate, the temporary layer being configured to comprise silicon (Si); and
forming an epilayer on the temporary layer, the epilayer being configured to comprise gallium nitride (GaN),
wherein, while the epilayer is being formed, the silicon (Si) is diffused from the temporary layer through a top surface of the supporting substrate to form a Si-diffused layer at an upper part of the supporting substrate.

10. The method of claim 9, wherein the temporary layer is a silicon oxide ($SiO_2$) layer or a silicon (Si) layer.

11. The method of claim 9, wherein the gallium nitride (GaN) has a wurtzite crystal structure.

* * * * *